United States Patent
Gutta et al.

(10) Patent No.: US 10,103,744 B1
(45) Date of Patent: Oct. 16, 2018

(54) POWER SCALING A CONTINUOUS-TIME DELTA SIGMA MODULATOR

(71) Applicant: Analog Devices Global, Hamilton (BM)

(72) Inventors: Avinash Gutta, Bangalore (IN);
Venkata Aruna Srikanth Nittala, Bengaluru (IN); Abhilasha Kawle, Bangalore (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/485,919

(22) Filed: Apr. 12, 2017

(51) Int. Cl.
*H03M 3/00* (2006.01)
*H03M 1/12* (2006.01)

(52) U.S. Cl.
CPC .............. *H03M 3/322* (2013.01); *H03M 1/12* (2013.01); *H03M 3/30* (2013.01)

(58) Field of Classification Search
CPC ........... H03M 3/322; H03M 3/30; H03M 1/12
USPC .................................................. 341/143, 155
See application file for complete search history.

(56) References Cited

U.S. PATENT DOCUMENTS

| | | | | |
|---|---|---|---|---|
| 5,646,621 | A * | 7/1997 | Cabler .................... | G06F 7/026 341/143 |
| 5,757,299 | A * | 5/1998 | Noro ..................... | H03M 3/444 341/143 |
| 6,567,025 | B2 * | 5/2003 | Schreier ................ | H03M 3/482 341/139 |
| 6,670,902 | B1 * | 12/2003 | Melanson ............. | H03M 3/368 341/143 |
| 7,268,715 | B2 * | 9/2007 | Guimaraes .............. | H03M 3/48 341/143 |
| 8,223,053 | B2 * | 7/2012 | Deval ................. | H03M 1/0663 341/143 |
| 8,324,969 | B2 * | 12/2012 | Loeda .................. | H03G 1/0088 327/564 |
| 9,014,306 | B2 * | 4/2015 | Etemadi .............. | H04L 27/3863 375/324 |

* cited by examiner

*Primary Examiner* — Brian Young
(74) *Attorney, Agent, or Firm* — Schwegman Lundberg & Woessner, P.A.

(57) ABSTRACT

A delta sigma modulator circuit comprises a forward circuit path including a first integrator stage and an analog-to-digital converter (ADC) circuit, wherein a transfer function of the forward circuit path includes a signal gain element of m, wherein m is a positive integer; an input path to the first integrator stage, wherein a transfer function of the input path includes a signal gain element of l/m; and a feedback circuit path operatively coupled to an output of the ADC circuit and an inverting input of an op amp of the first integrator stage, wherein the feedback circuit path includes at least a first digital-to-analog converter (DAC) circuit and a transfer function of the feedback circuit path includes a signal gain element of l/m.

20 Claims, 5 Drawing Sheets

POWER SCALING A CONTINUOUS-TIME DELTA SIGMA MODULATOR

BACKGROUND

Electronic systems can include analog-to-digital (A/D) converters (ADCs). Converting analog signals to digital quantities allow processors of electronic systems to perform signal processing functions for the systems. A delta sigma modulator can include an ADC and is used in converting signals in the audio band and in precision industrial measurement applications. It is desirable to reduce the power consumption in integrated circuit delta sigma modulators so that devices that include the modulators are more autonomous and require less maintenance. The present inventors have recognized a need for improved performance of delta sigma modulators.

OVERVIEW

This document relates generally to delta sigma modulator circuits, and in particular to reducing circuit power in delta sigma modulator circuits. An example delta sigma modulator circuit includes a forward circuit path including a first integrator stage and an analog-to-digital converter (ADC) circuit, wherein a transfer function of the forward circuit path includes a signal gain element of m, wherein m is a positive integer; an input path to the first integrator stage, wherein a transfer function of the input path includes a signal gain element of 1/m; and a feedback circuit path operatively coupled to an output of the ADC circuit and an inverting input of an op amp of the first integrator stage, wherein the feedback circuit path includes at least a first digital-to-analog converter (DAC) circuit and a transfer function of the feedback circuit path includes a signal gain element of 1/m.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
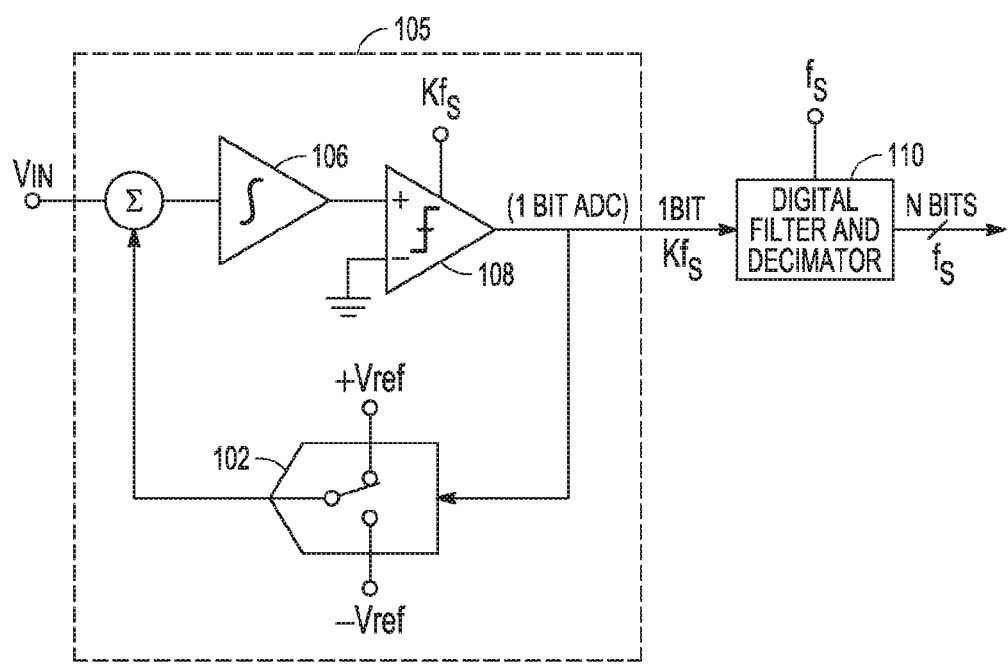
FIG. 1 is a block diagram of an example of a first order delta sigma modulator.

FIG. 1 is a block diagram of an example of a first order single bit delta sigma modulator. A delta sigma modulator 100 converts an input signal (Vin) into a continuous serial stream of ones and zeros at a rate determined by a sampling clock frequency $Kf_s$. A one-bit digital to analog converter (DAC) 102 is driven by the serial output data stream to generate a feedback signal. The output of the DAC 102 is subtracted from the input signal using a summing element 104. Typically, the summing element 104 is implemented as the summing junction of an operational amplifier (op amp) such as the op amp of the integrator 106. The integrator 106 integrates the output of summing element 104, and the output of the integrator 106 is applied to a clocked latched comparator 108.

For an input signal of zero, the comparator output includes an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output is applied to a digital filter and decimator 110 that averages every M cycles, where M is a positive integer greater than 1. The decimator reduces the effective sampling rate at the output to $f_s$.

Figure 2:
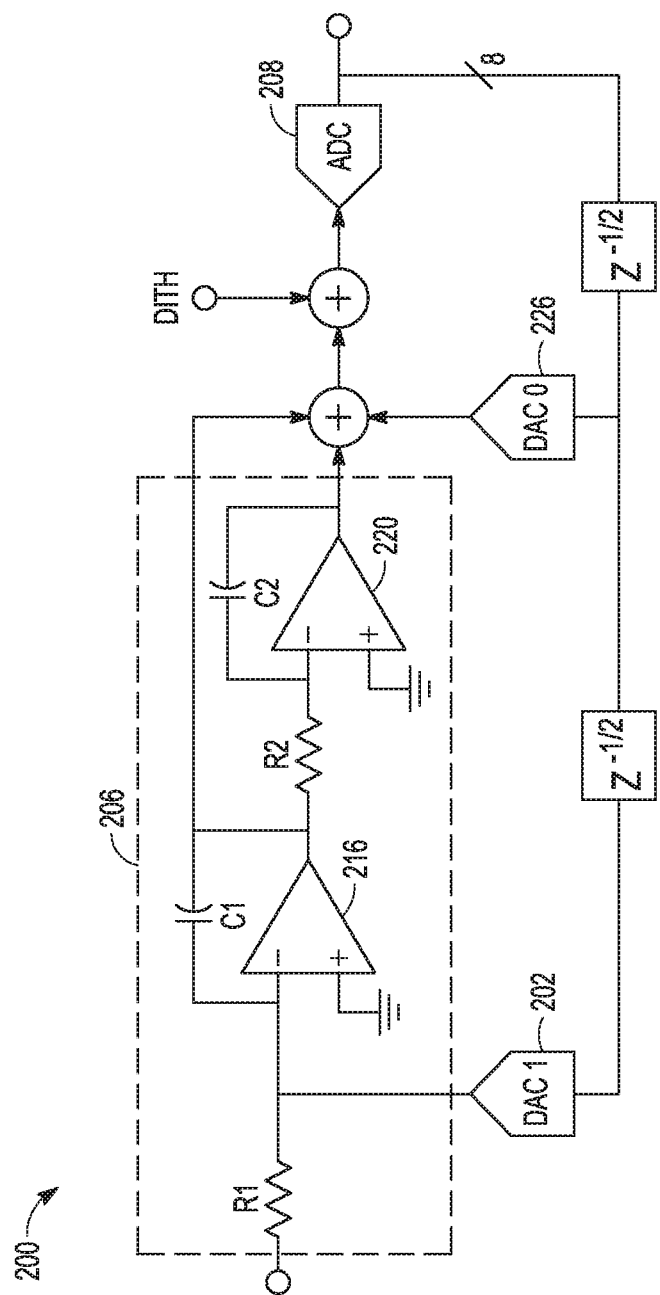
FIG. 2 is a block diagram of portions of an example of a sigma delta modulator circuit.

FIG. 2 is a block diagram of portions of an example of a delta sigma modulator circuit. The delta sigma modulator circuit 200 includes a forward circuit path and a feedback path. The forward circuit path includes an ADC circuit 208 and a loop filter circuit 206. In certain examples, the loop filter is a continuous time filter circuit. The loop filter circuit 206 includes one or more integrator stages. The number of integrator stages sets the order of the transfer function of the loop filter circuit. The example of FIG. 2 includes two integrator stages and the loop filter circuit 206 is a second order filter. The example of FIG. 1 is a first order filter. The actual coefficients of the transfer function are determined by the values of the components of the integrator circuits.

In FIG. 2 the first integrator stage includes a first operational amplifier (op-amp) 216, resistor R1, and capacitor C1. The input signal is received at resistor R1. The second integrator second includes a second op-amp 220, resistor R2, and capacitor C2. The outputs of both of the integrator stages are provided to summing node 224 at the output of the loop filter circuit 206. The ADC circuit 208 may include a latched comparator circuit to provide a one-bit A/D conversion. In some examples, the ADC circuit provides a multi-bit analog-to-digital (A/D) conversion. The ADC circuit 208 can include an N bit Flash ADC circuit, wherein N is an integer greater than one. The ADC circuit 208 provides a digital signal determined from the analog input signal and is sometimes referred to as a quantizer. The loop filter circuit 206 reduces quantization noise due to the quantization by the ADC circuit 208.

The feedback circuit path extends from the output of the ADC circuit 208 to the inverting input of the first op-amp 216. The feedback circuit path includes a first DAC circuit 202. The DAC circuit 202 performs the inverse function of the ADC circuit and converts the digital code at the output of the ADC circuit to an analog voltage or current. The D/A conversion is provided to the forward circuit path to close the delta-sigma modulator loop. The two circuit blocks labeled $Z^{-1/2}$ together add one clock delay in the feedback circuit path with each $Z^{-1/2}$ block providing one-half clock delay. The example of FIG. 2 also includes a second DAC circuit 226 in the feedback circuit path. The input of the second DAC circuit 226 is connected to the output of the ADC circuit 208 and the output of the second DAC circuit 226 is connected to the summing node 224. The DAC circuits provide analog voltage or current to the forward circuit path and also can provide coefficients for the transfer function of the feedback circuit path. The example of FIG.

2 also shows a dither signal input. A dither signal is used to reduce idle tones in the delta sigma modulator. An idle tone is a discrete peak in the frequency spectrum of the output of the delta signal modulator and is a source of noise.

As explained previously herein, it is desirable to reduce the power consumption in delta sigma modulators. The ADC circuit and the DAC circuit are operated at a modulation clock frequency ($f_m$). One way to reduce the power consumption would be to slow down the modulation frequency to reduce switching of circuit components, such as reducing switching of the circuit components of the DAC circuit or circuits, and the ADC circuit. The reduction in power scales linearly with the down-scaling of the modulation frequency.

Figure 3A:
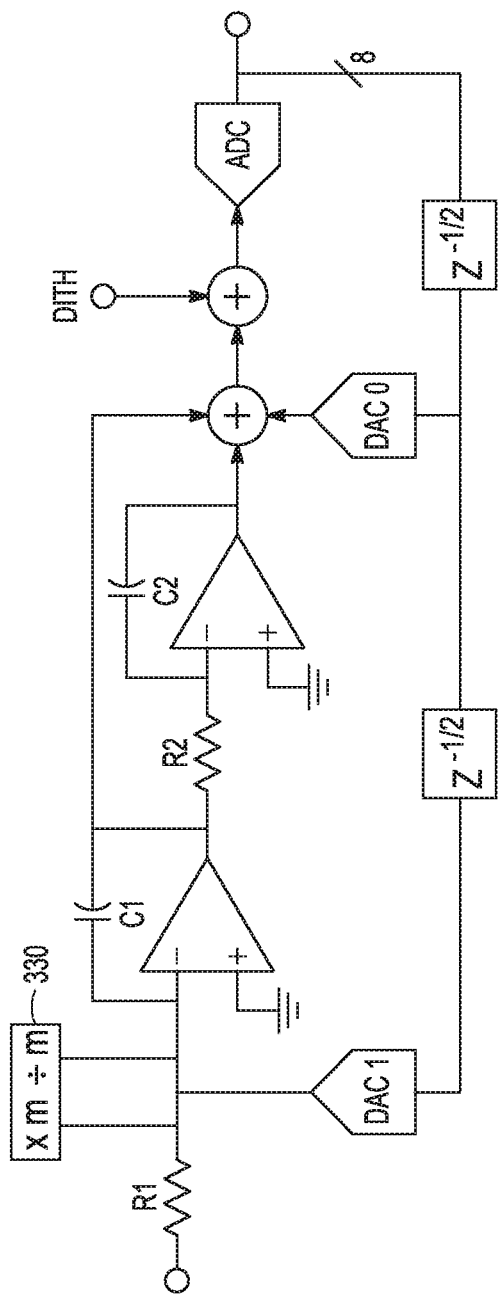
FIGS. 3A and 3B are block diagrams of portions of another example of a sigma delta modulator circuit.
Figure 3B:
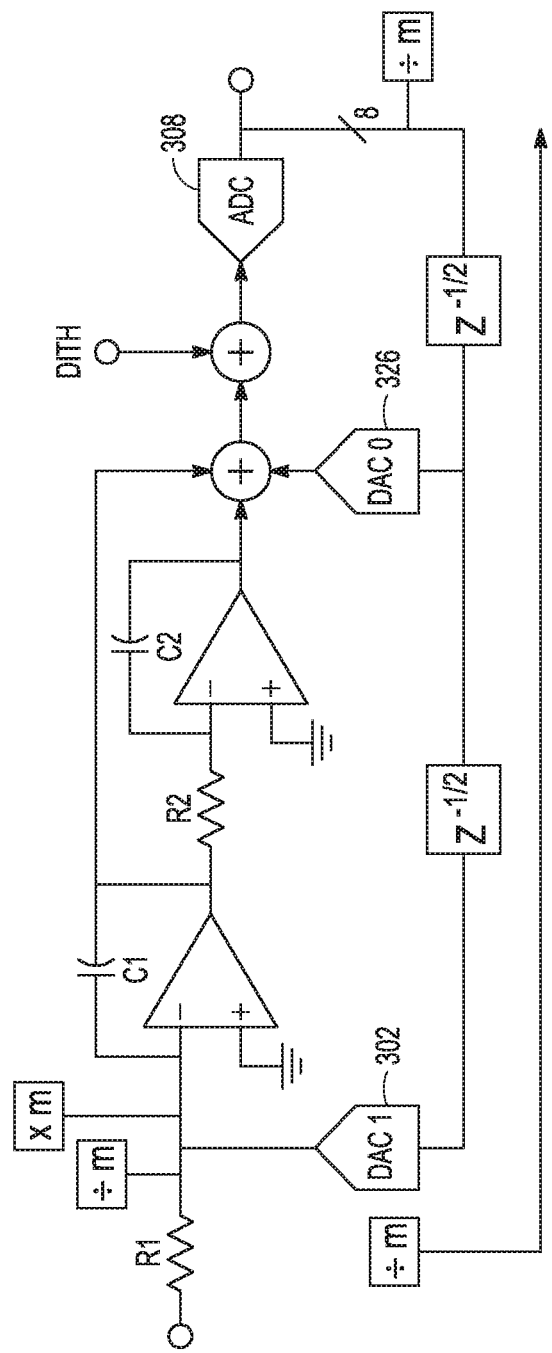

FIGS. 3A and 3B are block diagrams of the delta sigma modulator circuit of FIG. 2. FIG. 3A is a block diagram of the delta sigma modulator circuit of FIG. 2 with the addition of a hypothetical blackbox 330 circuit component added to the feedforward circuit path. The blackbox adds a gain of m (times m) and a gain of l/m (divide by m), m being some number. It can be seen that the blackbox does not change the overall transfer function of the circuit of FIG. 2 because the net gain added by the blackbox is one. In FIG. 3B, the "times m" portion of the blackbox in FIG. 3A is applied to the forward circuit path and the "divide by m" portion is applied to the feedback circuit path and to an input path that receives the input signal. This makes the difference in magnitude in gain between the forward path and the feedback circuit path equal to m divided by l/m, or $m^2$. The distribution of the gain portions in FIG. 3B does not affect the overall loop transfer function of the delta sigma modulator and the loop transfer is the same as if the "times m" portion and the "divide by m" portion were contained within the blackbox 330 of FIG. 3A.

This distributing of the gain in combination with the scaling down of the modulation clock frequency provides advantages in reducing power consumption. Scaling down the modulation clock frequency by a factor of m or ($f_m$/m) directly reduces power consumption by a factor of m. Part of the savings in power is realized by the slower switching of the DAC circuit or circuits. Additionally, because the gain in the feedback circuit path is l/m, the digital code produced by the output of the ADC circuit 308 is scaled according to l/m. This means that the DAC produces a scaled down range of voltage or current, which also can reduce the power consumption by m. For example, if m=2, reducing the frequency $f_m$ of the modulation clock reduces power consumption of the delta sigma modulator by 2. If the DAC circuit produces a current I in the feedback circuit path based on the digital code produced by the ADC circuit 308, the current is scaled down to I/m or I/2 in this example. Also, the number of DAC circuit elements is reduced because of the reduced current range needed. This can result in another reduction in power consumption by 2. Thus, the combination of reduction in clock frequency and change in gain reduces power consumption by 4.

In some examples, the DAC circuit 302 includes a table of digital codes. The digital codes received from the ADC circuit are crossed referenced in the table to produce an analog current or voltage. In some examples, the table of digital codes can be stored in a flash memory circuit included in the DAC circuit. Because of the reduction in the range of current or voltage needed, the size of the table can be reduced. This can provide additional reduction in the power used by the feedback circuit path. For instance, using the example of m=2, the size of the table required for the DAC circuit conversion is reduced by 2 because the range of current is reduced by 2. This can reduce the static power needed for the table by 2. Also, reducing the clock frequency reduces the frequency of accessing the table by 2. This reduction in power consumption applies to operation of DAC circuit 326 as well. The value of m=2 is just an example, and other values can be used for m including non-integer values.

In the forward circuit path, the values or resistance and capacitance of the integrator stages can be determined as a function of the modulation clock frequency, or RC=f($f_m$). Because the frequency of modulation is scaled down by a factor of m to $f_m$/m, the forward circuit path includes a signal gain element of m, and the input path includes a signal gain element of l/m, the RC product of the first integrator stage R1C1 can remain unchanged from the sizing for a clock frequency of $f_m$, and the RC product of the second integrator stage (R2*C2) can be determined as a function of $f_m$/m (e.g., R2*C2 is proportional to $f_m$/m). This can result in a value of R2*C2 being m times greater than the value of R1*C1. In general, accurate sizing of capacitors is more reliable than sizing resistors. In some examples, reducing the modulation clock frequency and adding a gain element of m to the forward circuit path results in the value of capacitance of C2 being m times the value of capacitance of C1.

Because one or both of the resistance and capacitance only needs to be changed for one integrator stage, power consumption is less than if an impedance was changed for both integrator stages because of the change to the modulation clock. Thus, adding the signal gain element m to the forward circuit path and adding the signal gain element l/m to the input path reduces power consumption of the forward circuit path than if the modulation clock frequency is reduced without introducing the signal gain elements in the forward circuit path and input path. It can be seen that distributing signal gain in a delta sigma modulator greatly reduces power consumption over merely slowing the modulation clock. The l/m signal gain element in the input path can be implemented by scaling the input resistor or adding an active element (e.g., an op amp) to scale the input signal. The approach that results in the lower power consumption may depend on the impact of scaling the input resistor on the first integrator stage.

Figure 4:
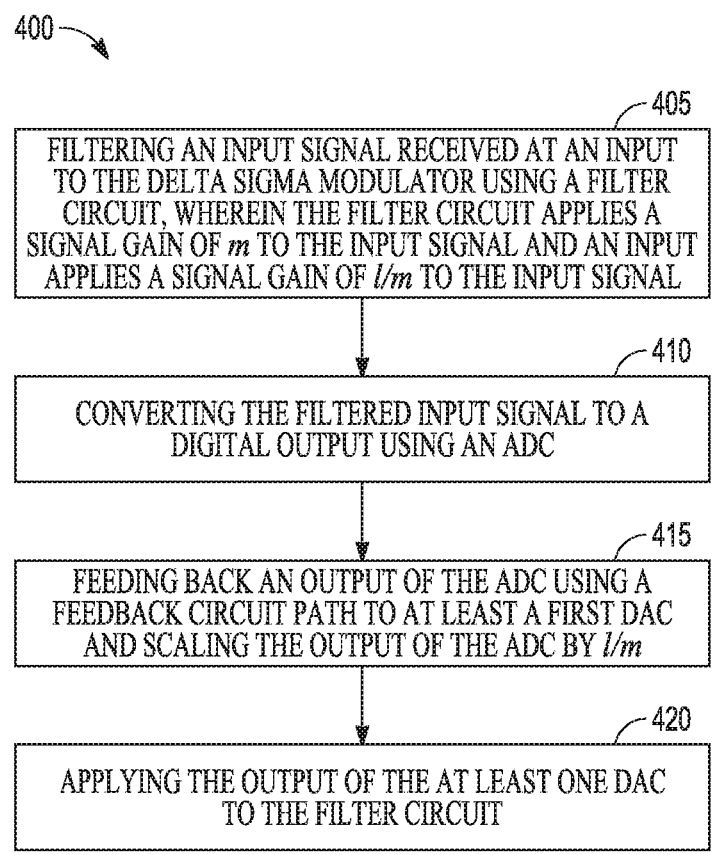
FIG. 4 is a flow diagram of an example of operating a delta sigma modulator.

FIG. 4 is a flow diagram of a method 400 of controlling operation of a delta sigma modulator. At 405, an input signal is received at an input to the delta sigma modulator, and a signal gain of l/m is applied to the input signal. The input signal is filtered using a filter circuit that applies a signal gain of m to the input signal. The filter circuit can include one or more integrator circuit stages as shown in the example of FIG. 2.

At 410, the filtered input signal is converted to a digital output using an ADC. At 415, the output of the ADC is fed back using a feedback circuit path to at least a first DAC. The feeding back includes scaling the output of the ADC by l/m. Thus, there is a difference in signal gain between a forward circuit path that includes the filter circuit and a feedback circuit path that includes one or more DACs. The difference in gain between the forward path and the feedback circuit path can m divided by l/m, or $m^2$. At 420, the output of the at least one DAC is applied to the filter circuit to close the delta-sigma modulator loop. While the method has been described in terms of a continuous-time delta sigma modulator. Some of the approaches in the method can be extended to discrete time delta-sigma modulators.

The several devices and methods described reduce power consumption in a delta sigma modulators. It can be seen in the examples that distributing signal gain in a delta sigma modulator greatly reduces power consumption over merely slowing the modulation clock. A cost for the power reduction may occur as a tradeoff in the signal-to-quantization noise ratio (SQNR). The SQNR may be degraded due to the reduction in DAC levels of the DAC circuits. This is because the range of the DAC is reduced but the step size between current or voltage values stays the same. Thus, it may be desirable to use the power reduced delta sigma modulator in applications requiring lower bandwidth where SQNR is less of a concern.

ADDITIONAL DESCRIPTION AND EXAMPLES

Example 1 can include subject matter (such as a delta sigma modulator circuit) comprising a forward circuit path including a first integrator stage and an analog-to-digital converter (ADC) circuit, wherein a transfer function of the forward circuit path includes a signal gain element of m, wherein m is a positive integer; an input path to the first integrator stage, wherein a transfer function of the input path includes a signal gain element of 1/m; and a feedback circuit path operatively coupled to an output of the ADC circuit and an inverting input of an op amp of the first integrator stage, wherein the feedback circuit path includes at least a first digital-to-analog converter (DAC) circuit and a transfer function of the feedback circuit path includes a signal gain element of 1/m.

In Example 2, the subject matter of Example 1 optionally includes a second integrator stage, wherein the ADC circuit and the at least the first DAC circuit are operated at a modulation clock frequency ($f_m$), wherein the first integrator stage includes a first resistor and a first capacitor and the second integrator stage includes a second resistor and a second capacitor, wherein one or both of a value of resistance of the first resistor and a value of capacitance of the first capacitor are determined as a function of the modulation clock frequency ($f_m$), and one or both of a value of a resistance of the second resistor and the second capacitor are determined as a function of m divided by the modulation clock frequency ($f_m/m$).

In Example 3 the subject matter of Example 1 optionally includes a second integrator stage, wherein the first integrator stage includes a first capacitor and the second integrator stage includes a second capacitor, wherein a value of capacitance of the second capacitor is m times a value of capacitance of the first capacitor.

In Example 4, the subject matter of one or any combination of Examples 1-3 optionally includes an ADC circuit and a DAC circuit that are operated at a modulation clock frequency ($f_m$) that is m times slower than a modulation clock frequency when the feedback circuit path excludes the signal gain element of 1/m.

In Example 5, the subject matter of one or any combination of Examples 1-4 optionally includes a signal gain element 1/m in the feedback circuit path that scales a current to I/m, wherein I is the current when the feedback circuit path excludes the 1/m signal gain element, and wherein the at least the first DAC circuit includes a table of digital codes to scale the I/m current in the feedback circuit path.

In Example 6, the subject matter of Example 5 optionally includes a table of digital codes is stored in a flash memory circuit.

In Example 7, the subject matter of one or any combination of Examples 1 and 4-6 optionally includes a second integrator stage and a second DAC circuit, wherein the second DAC circuit includes a DAC input connected to the output of the ADC circuit, and a DAC output, wherein the DAC output, an output of the first integrator stage, and an output of the second integrator stage are connected to an output of the filter circuit.

In Example 8, the subject matter of one or any combination of Examples 2, 3, and 7 optionally includes the first integrator stage and the second integrator stage being included in a continuous time filter circuit.

In Example 9, the subject matter of Example 7 optionally includes the feedback circuit path delays the output of the ADC circuit one-half clock cycle of a modulation clock signal at the input of the second DAC circuit and delays the output of the ADC circuit one clock cycle of the modulation clock signal at the input of the first DAC circuit.

In Example 10, the subject matter of one or any combination of Examples 1-9 optionally includes an ADC circuit that includes a latched comparator circuit.

In Example 11, the subject matter of one or any combination of Examples 1-9 optionally includes an ADC circuit that includes an N bit Flash ADC circuit, wherein N is an integer greater than one.

Claim 12 includes subject matter (such as a method of controlling operation of a delta sigma modulator, a means for performing acts, or a machine-readable medium including instructions that, when performed by the machine, cause the machine to perform acts), or can optionally be combined with the subject matter of one or any combination of Examples 1-11 to include such subject matter, comprising: filtering an input signal received at an input to the delta sigma modulator using a filter circuit, wherein the filter circuit applies a signal gain of m to the input signal and the input applies a signal gain of 1/m to the input signal; converting the filtered input signal to a digital output using an analog-to-digital converter (ADC); feeding back an output of the ADC using a feedback circuit path to at least a first digital-to-analog converter (DAC), wherein the feeding back includes scaling the output of the ADC by 1/m; and applying the output of the at least one DAC to the filter circuit.

In Example 13, the subject matter of Example 12 optionally includes operating the ADC circuit and the DAC circuit using a modulation clock frequency ($f_m$), wherein filtering the input signal includes applying the input signal to a continuous time filter circuit that includes a first integrator stage and a second integrator stage, wherein the first integrator stage includes a first resistor and a first capacitor and the second integrator stage includes a second resistor and a second capacitor, wherein a value of resistance of the first resistor and a value of capacitance of the first capacitor are determined as a function of the modulation clock frequency ($f_m$), and a value of resistance of the second resistor and the second capacitor are determined as a function of m divided by the modulation clock frequency ($f_m/m^*$).

In Example 14, the subject matter of one or both of Example 12 and 13 optionally includes filtering the input signal using a continuous time filter circuit that includes a first integrator stage having a first capacitor and a second integrator stage having a second a capacitor, wherein a value of capacitance of the second capacitor is m times a value of capacitance of the first capacitor.

In Example 15, the subject matter of one or any combination of Examples 12-14 optionally includes operating the ADC circuit and the DAC circuit using a modulation clock frequency ($f_m$), wherein the modulation clock frequency is m times slower than a modulation clock frequency when the feedback circuit path excludes the signal gain element of 1/m.

In Example 16, the subject matter of one or any combination of Examples 12-15 optionally includes scaling a current to I/m, wherein I is the current when the feedback circuit path excludes the l/m signal gain element, and wherein the method includes converting the output of the ADC circuit using a table of digital codes to scale the I/m current in the feedback circuit path.

In Example 17, the subject matter of one or any combination of Examples 12-16 optionally includes feeding back the output of the ADC to a first a DAC and a second DAC, and wherein the applying the output of the at least one DAC to the filter circuit includes applying the output of the first DAC to a first integrator stage of the filter circuit and summing the output of the second DAC with an output of the filter circuit.

Example 18 can include subject matter (such as an apparatus) or can optionally be combined with one or any combination of Examples 1-17 to include such subject matter comprising a delta sigma modulator, the delta sigma modulator including: a filter circuit including a first integrator stage and a second integrator stage, wherein the first integrator stage includes an operational amplifier (op amp); an analog-to-digital (ADC) circuit including an ADC input connected to an output of the filter circuit and an ADC output, wherein the filter circuit and the ADC circuit are included in a forward circuit path that includes a signal gain element of m in the filter circuit and a signal gain element of l/m at input to the filter circuit, wherein m is a positive integer; and a first digital-to-analog (DAC) circuit and a second DAC circuit, wherein the output of the first DAC circuit is applied to an inverting input of the op amp and the output of the second DAC circuit is applied to a summing node arranged at an output of the filter circuit and the ADC input, wherein the ADC output is applied to the inputs of the first and second DACs using a feedback circuit path and a transfer function of the feedback circuit path includes a signal gain element of l/m, and wherein the feedback circuit path delays the output of the ADC circuit one-half clock cycle of a modulation clock signal at the input of the second DAC circuit and delays the output of the ADC circuit one clock cycle of the modulation clock signal at the input of the first DAC circuit.

In Example 19, the subject matter of Example 18 optionally includes the ADC circuit and the at least the first DAC circuit are operated at a modulation clock frequency ($f_m$), wherein the first integrator stage includes a first resistor and a first capacitor and the second integrator stage includes a second resistor and a second capacitor, wherein a value of resistance of the first resistor and a value of capacitance of the first capacitor are determined as a function of the modulation clock frequency ($f_m$), and a value of resistance of the second resistor and the second capacitor are determined as a function of m divided by the modulation clock frequency ($f_m/m$).

In Example 20, the subject matter of one or both of Examples 18 and 19 optionally includes a signal gain element l/m in the feedback circuit path that scales a current to I/m, wherein I is the current when the feedback circuit path excludes the l/m signal gain element, and wherein the at least the first DAC circuit includes a table of digital codes to scale the I/m current in the feedback circuit path.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A delta sigma modulator circuit comprising:
   a forward circuit path including a first integrator stage and an analog-to-digital converter (ADC) circuit, wherein a transfer function of the forward circuit path includes a signal gain element providing a signal gain in the forward circuit path;
   a feedback circuit path operatively coupled to an output of the ADC circuit and an operational amplifier (op amp) of the first integrator stage, wherein the feedback circuit path includes at least a first digital-to-analog converter (DAC) circuit and a transfer function of the feedback circuit path includes a signal gain element providing a signal gain of the inverse of the signal gain of the forward circuit path; and
   an input path operatively coupled to the first integrator stage and the feedback path, wherein a transfer function of the input path includes a signal gain element providing a signal gain of the inverse of the signal gain of the forward circuit path.

2. The delta sigma modulator circuit of claim 1, including a second integrator stage, wherein the ADC circuit and the at least the first DAC circuit are operated at a modulation clock frequency ($f_m$), wherein the first integrator stage includes a first resistor and a first capacitor and the second integrator stage includes a second resistor and a second capacitor, wherein one or both of a value of resistance of the first resistor and a value of capacitance of the first capacitor are determined as a function of the modulation clock frequency ($f_m$), and one or both of a value of a resistance of the second resistor and the second capacitor are determined as a function of the modulation clock frequency divided by m ($f_m/m$), wherein m is the signal gain provided by the signal gain element in the forward circuit path.

3. The delta sigma modulator circuit of claim 1, wherein the forward circuit path includes a second integrator stage, wherein the first integrator stage includes a first capacitor and the second integrator stage includes a second capacitor, wherein a capacitor ratio includes a capacitance of the first capacitor and a capacitance of the second capacitor;
   wherein the signal gain element of the feedback circuit path provides a signal gain of an inverse of a value of the capacitor ratio; and
   wherein the transfer function of the input path provides a signal gain of the inverse of the value of the capacitor ratio.

4. The delta sigma modulator circuit of claim 1, wherein the signal gain element in the input path includes a resistive circuit element, and the signal gain element of the forward circuit path includes a capacitor of the first integrator stage.

5. The delta sigma modulator circuit of claim 1, wherein the signal gain element in the feedback circuit path scales a current I as a function of the signal gain of the feedback circuit path, wherein I is the current when the feedback circuit path excludes the signal gain element, and wherein the at least the first DAC circuit includes a table of digital codes to scale the current in the feedback circuit path.

6. The delta sigma modulator circuit of claim 5, wherein the table of digital codes is stored in a flash memory circuit.

7. The delta sigma modulator circuit of claim 1, including a second integrator stage and a second DAC circuit, wherein the second DAC circuit includes a DAC input connected to the output of the ADC circuit, and a DAC output, wherein the DAC output, an output of the first integrator stage, and an output of the second integrator stage are connected to an output of the filter circuit.

8. The delta sigma modulator circuit of claim 7, wherein the first integrator stage and the second integrator stage are included in a continuous time filter circuit.

9. The delta sigma modulator circuit of claim 7, wherein the feedback circuit path delays the output of the ADC circuit one-half clock cycle of a modulation clock signal at the input of the second DAC circuit and delays the output of the ADC circuit one clock cycle of the modulation clock signal at the input of the first DAC circuit.

10. The delta sigma modulator circuit of claim 1, wherein the ADC circuit includes a latched comparator circuit.

11. The delta sigma modulator circuit of claim 1, wherein the ADC circuit includes an N bit Flash ADC circuit, wherein N is an integer greater than one.

12. A method of controlling operation of a delta sigma modulator, the method comprising:
   applying a signal gain to an input signal received by the delta sigma modulator using an input path of the delta sigma modulator;
   receiving an output of the input path at an integrator stage of a filter circuit of a forward circuit path to generate a filtered signal, wherein the forward circuit path provides a signal gain of the inverse of the signal gain applied to the input signal by the input path;
   converting the filtered signal to a digital output using an analog-to-digital converter (ADC); and
   feeding back an output of the ADC to the integrator stage of the filter circuit using a feedback circuit path that includes at least a first digital-to-analog converter (DAC), wherein the feeding back includes scaling the output of the ADC by the signal gain applied to the input signal by the input path.

13. The method of claim 12, including operating the ADC circuit and the DAC circuit using a modulation clock frequency ($f_m$), wherein generating a filtered signal includes applying the input signal to a continuous time filter circuit that includes a first integrator stage and a second integrator stage, wherein the first integrator stage includes a first resistor and a first capacitor and the second integrator stage includes a second resistor and a second capacitor, wherein a value of resistance of the first resistor and a value of capacitance of the first capacitor are determined as a function of the modulation clock frequency ($f_m$), and a value of resistance of the second resistor and the second capacitor are determined as a function of the modulation clock frequency divided by m ($f_m/m$), wherein m is the signal gain provided by the signal gain element in the forward circuit path.

14. The method of claim 12, wherein filtering the input signal includes filtering the input signal using a continuous time filter circuit that includes a first integrator stage having a first capacitor and a second integrator stage having a second a capacitor, wherein a value of capacitance of the second capacitor is a value of capacitance of the first capacitor scaled by the value of the signal gain provided by the filter circuit.

15. The method of claim 12, including operating the ADC circuit and the DAC circuit using a modulation clock frequency wherein generating a filtered signal includes applying the input signal to a continuous time filter circuit that includes a first integrator stage and a second integrator stage, wherein the first integrator stage includes a first capacitor, the second integrator stage includes a second capacitor, the input path includes a first resistor, and the continuous time filter circuit includes a second resistor; and
   wherein a value of resistance of the first resistor and a value of capacitance of the first capacitor are determined as a function of the modulation clock frequency, and a value of resistance of the second resistor and the second capacitor are determined as a function of the modulation clock frequency and the signal gain applied to the input signal.

16. The method of claim 12, wherein scaling the output of the ADC by the signal gain applied to the input signal includes scaling a current as a function of the signal gain of the feedback circuit path, wherein I is the current when the feedback circuit path excludes the signal gain element, and wherein the method includes converting the output of the ADC circuit using a table of digital codes to scale the current in the feedback circuit path.

17. The method of claim 12, wherein feeding back an output of the ADC includes feeding back the output of the ADC to a first a DAC and a second DAC, and wherein the applying the output of the at least one DAC to the filter circuit includes applying the output of the first DAC to a first integrator stage of the filter circuit and summing the output of the second DAC with an output of the filter circuit.

18. An apparatus comprising a delta sigma modulator, the delta sigma modulator including:

a filter circuit including a first integrator stage and a second integrator stage, wherein the first integrator stage includes an operational amplifier (op amp);

an analog-to-digital (ADC) circuit including an ADC input connected to an output of the filter circuit and an ADC output, wherein the filter circuit and the ADC circuit are included in a forward circuit path that includes a first signal gain element in the filter circuit that provides first signal gain, and a second signal gain element at an input to the filter circuit that provides second signal gain, wherein the second signal gain is an inverse of the first signal gain; and a first digital-to-analog (DAC) circuit and a second DAC circuit, wherein the output of the first DAC circuit is applied to an inverting input of the op amp and the output of the second DAC circuit is applied to a summing node arranged at an output of the filter circuit and the ADC input, wherein the ADC output is applied to the inputs of the first and second DACs using a feedback circuit path and a transfer function of the feedback circuit path includes a third signal gain element that provides third signal gain that is the inverse of the first signal gain, and wherein the feedback circuit path delays the output of the ADC circuit one-half clock cycle of a modulation clock signal at the input of the second DAC circuit and delays the output of the ADC circuit one clock cycle of the modulation clock signal at the input of the first DAC circuit.

19. The apparatus of claim 18, wherein the ADC circuit and the at least the first DAC circuit are operated at a modulation clock frequency ($f_m$), wherein the first integrator stage includes a first resistor and a first capacitor and the second integrator stage includes a second resistor and a second capacitor, wherein a value of resistance of the first resistor and a value of capacitance of the first capacitor are determined as a function of the modulation clock frequency ($f_m$), and a value of resistance of the second resistor and the second capacitor are determined as a function of the modulation clock frequency divided by m ($f_m/m$), wherein m is the first signal gain.

20. The apparatus of claim 18, wherein the delta sigma modulator includes:

a first resistor arranged at the input to the filter circuit and a second resistor arranged in the forward circuit path;

wherein the first integrator stage includes a first capacitor and the second integrator stage includes a second capacitor;

wherein the ADC circuit and the first and second DAC circuits are operated at a modulation clock frequency; and wherein one or both of a value of resistance of the first resistor and a value of capacitance of the first capacitor are determined as a function of the modulation clock frequency, and one or both of a value of a resistance of the second resistor and the second capacitor are determined as a function of the modulation clock frequency and the signal gain in the forward circuit path.

* * * * *

UNITED STATES PATENT AND TRADEMARK OFFICE
CERTIFICATE OF CORRECTION

PATENT NO. : 10,103,744 B1
APPLICATION NO. : 15/485919
DATED : October 16, 2018
INVENTOR(S) : Gutta et al.

Page 1 of 1

It is certified that error appears in the above-identified patent and that said Letters Patent is hereby corrected as shown below:

In the Claims

In Column 10, Line 53, in Claim 16, after "current", insert --I--

Signed and Sealed this
Eighteenth Day of June, 2019

Andrei Iancu
*Director of the United States Patent and Trademark Office*